US008753925B2

United States Patent
Oganesian (10) Patent No.: US 8,753,925 B2
(45) Date of Patent: Jun. 17, 2014

(54) METHOD OF MAKING 3D INTEGRATION MICROELECTRONIC ASSEMBLY FOR INTEGRATED CIRCUIT DEVICES

(71) Applicant: Optiz, Inc., Palo Alto, CA (US)

(72) Inventor: Vage Oganesian, Sunnyvale, CA (US)

(73) Assignee: Optiz, Inc., Palo Alto, CA (US)

( * ) Notice: Subject to any disclaimer, the term of this patent is extended or adjusted under 35 U.S.C. 154(b) by 0 days.

(21) Appl. No.: 14/013,328

(22) Filed: Aug. 29, 2013

(65) Prior Publication Data

US 2014/0004664 A1    Jan. 2, 2014

Related U.S. Application Data

(62) Division of application No. 13/157,207, filed on Jun. 9, 2011, now Pat. No. 8,546,951.

(51) Int. Cl.
*H01L 21/44* (2006.01)
*H01L 21/48* (2006.01)
*H01L 21/50* (2006.01)

(52) U.S. Cl.
USPC .......................................... 438/125; 257/774

(58) Field of Classification Search
USPC .............. 257/774, E23.01, E21.505; 438/125
See application file for complete search history.

(56) References Cited

U.S. PATENT DOCUMENTS

| 5,208,478 | A | 5/1993 | Solomon |
|---|---|---|---|
| 8,288,243 | B2 | 10/2012 | Jacobsen et al. |
| 2003/0148552 | A1* | 8/2003 | Halahan ....................... 438/106 |
| 2004/0251525 | A1 | 12/2004 | Zilber |
| 2005/0104179 | A1 | 5/2005 | Zilber |
| 2005/0205977 | A1 | 9/2005 | Zilber |
| 2006/0091509 | A1* | 5/2006 | Zhao et al. ..................... 257/678 |
| 2007/0077727 | A1 | 4/2007 | Huang et al. |
| 2007/0138498 | A1 | 6/2007 | Zilber |
| 2007/0190691 | A1 | 8/2007 | Humpston |
| 2007/0190747 | A1 | 8/2007 | Humpston |
| 2008/0012115 | A1 | 1/2008 | Zilber |
| 2008/0017879 | A1 | 1/2008 | Zilber |
| 2008/0083976 | A1 | 4/2008 | Haba |
| 2008/0083977 | A1 | 4/2008 | Haba |
| 2008/0099900 | A1 | 5/2008 | Oganesian |
| 2008/0099907 | A1 | 5/2008 | Oganesian |
| 2008/0116544 | A1 | 5/2008 | Grinman |
| 2008/0116545 | A1 | 5/2008 | Grinman |

(Continued)

OTHER PUBLICATIONS

U.S. Appl. No. 13/157,193, filed Jun. 9, 2011, Oganesian, Vage.

(Continued)

*Primary Examiner* — Phuc Dang
(74) *Attorney, Agent, or Firm* — DLA Piper LLP (US)

(57) ABSTRACT

A 3D interposer (and method of making same) that includes a crystalline substrate handler having opposing first and second surfaces, with a cavity formed into the first surface. A layer of insulation material is formed on the surface of the handler that defines the cavity. The cavity is filled with a compliant dielectric material. A plurality of electrical interconnects is formed through the interposer. Each electrical interconnect includes a first hole formed through the crystalline substrate handler extending from the second surface to the cavity, a second hole formed through the compliant dielectric material so as to extend from and be aligned with the first hole, a layer of insulation material formed along a sidewall of the first hole, and conductive material extending through the first and second holes.

10 Claims, 6 Drawing Sheets

(56) References Cited

U.S. PATENT DOCUMENTS

| | | |
|---|---|---|
| 2008/0150121 A1 | 6/2008 | Oganesian |
| 2008/0246136 A1 | 10/2008 | Haba |
| 2009/0115047 A1 | 5/2009 | Haba |
| 2009/0160065 A1 | 6/2009 | Haba |
| 2009/0212381 A1 | 8/2009 | Crisp |
| 2010/0053407 A1 | 3/2010 | Crisp |
| 2010/0225006 A1 | 9/2010 | Haba |
| 2010/0230812 A1 | 9/2010 | Oganesian |
| 2011/0012259 A1 | 1/2011 | Grinman |
| 2011/0031629 A1 | 2/2011 | Haba |
| 2011/0033979 A1 | 2/2011 | Haba |
| 2011/0049696 A1 | 3/2011 | Haba |
| 2011/0187007 A1 | 8/2011 | Haba |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian |

OTHER PUBLICATIONS

U.S. Appl. No. 13/157,202, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/312,826, filed Dec. 6, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/423,045, filed Mar. 16, 2012, Oganesian, Vage.
U.S. Appl. No. 13/609,002, filed Sep. 10, 2012, Oganesian, Vage.

* cited by examiner

FIG. 8

METHOD OF MAKING 3D INTEGRATION MICROELECTRONIC ASSEMBLY FOR INTEGRATED CIRCUIT DEVICES

RELATED APPLICATIONS

This application is a divisional of U.S. application Ser. No. 13/157,207, filed Jun. 9, 2011, U.S. Pat. No. 8,546,951.

FIELD OF THE INVENTION

The present invention relates to semiconductor packaging, and more particularly to a 3D interposer on which a semiconductor device is mounted.

BACKGROUND OF THE INVENTION

The trend for semiconductor devices is smaller integrated circuit devices (IC devices, also referred to as chips), packaged in smaller packages (which protect the chip while providing off chip signaling connectivity). 3D packaging, in which related chips are stacked inside a single package, has recently been developed and refined. 3D packaging can result in increased density and smaller form factor, better electrical performance (because of shorter interconnect length which allows for increased device speed and lower power consumption), better heterogeneous integration (i.e. integrate different functional layers such as an image sensor and its processor), and lower cost. Existing 3D IC packaging techniques used to form through-silicon via's (TSV's), including Via-First, Via-Last and Via-middle processes, utilize semiconductor lithographic processes which are inherently complex and costly. As a result, few companies in the world can afford the billions of dollars in CMOS R&D per year to keep pace.

Another related 3D packaging technology is the interposer. A conventional interposer is an insulation substrate (typically plastic or ceramic) with conductive patterns formed on, in and/or through the substrate to provide an electrical interface for semiconductor devices. Interposers are commonly used for chip assembly techniques employing the flip-chip method of using solder balls to create the electrical connections between the chip and the interposer. The interposer can provide electrical connections having a modified, increased, or decreased connection pattern or density relative to the electrical connection pattern or density on the semiconductor device.

More recently, with the advent of through-silicon vias, 3D silicon and glass interposers have been developed to increase the gap between printed circuit boards and integrated circuits, both in terms of geometries and materials, for use in System-in-Package (SiP), Package-on-package (PoP), flip-chip Ball grid Array (fc-BGA) or more recently fan-out Wafer Level Packaging. 3D interposers combine wafer-level techniques and advantages with 3D routing capabilities (e.g. higher resolution and finer pitches/densities).

Figure 1:
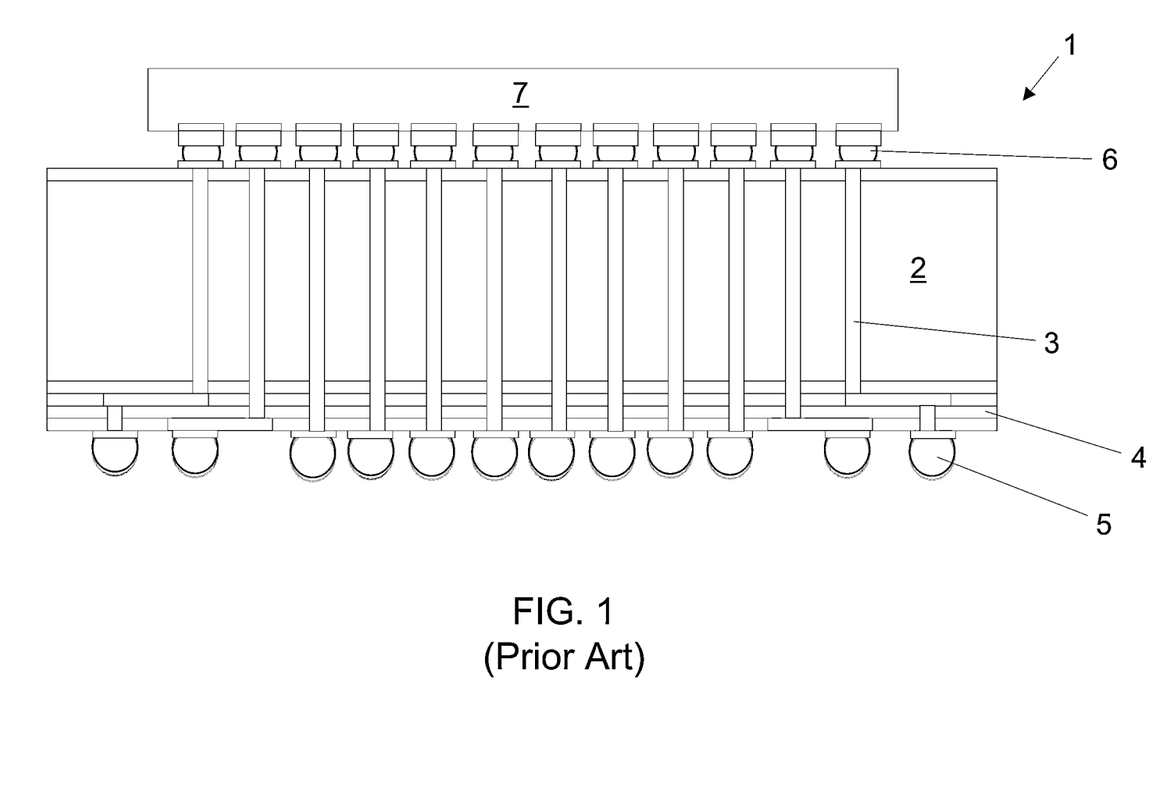
FIG. 1 is a cross sectional side view of a conventional interposer.

A conventional 3D interposer is illustrated in FIG. 1. The interposer 1 includes a silicon substrate 2, through silicon via's 3 extending through and forming an electrical contact through the substrate 2, routing layers 4 and SMT compatible contacts 5, flip chip connectors 6 (on which an IC chip 7 is mounted). One difficulty in manufacturing the interposer 1 involves the via's 3, which are difficult to fabricate as the width of the substrate 2 increases (e.g. requires expensive semiconductor sputtering tools). Moreover, the SMT contacts 5 between the interposer 1 and the underlying printed circuit board can fail due to thermal stress caused by the different thermal and mechanical characteristics between the interposer and PC board on which the interposer is mounted. A complementary, cost-effective TSV solution is needed to enhance the performance of 3D interposers.

BRIEF SUMMARY OF THE INVENTION

The present invention is a 3D interposer and method of making same that addresses the deficiencies of conventional interposers.

The interposer includes a crystalline substrate handler having opposing first and second surfaces wherein a cavity is formed into the first surface, a layer of insulation material disposed on a surface of the handler that defines the cavity, a compliant dielectric material disposed in the cavity, and a plurality of electrical interconnects. Each electrical interconnect includes a first hole formed through the crystalline substrate handler extending from the second surface to the cavity, a second hole formed through the compliant dielectric material so as to extend from and be aligned with the first hole, a layer of insulation material formed along a sidewall of the first hole, and conductive material extending through the first and second holes.

The method of forming the interposer includes forming a cavity in a crystalline substrate handler which has opposing first and second surfaces, wherein the cavity is formed into the first surface of the crystalline substrate handler, forming a plurality of first holes through the crystalline substrate handler extending from the second surface to the cavity, forming a layer of insulation material on a surface of the handler that defines the cavity and on sidewalls of the first holes, forming compliant dielectric material in the cavity, forming second holes through the compliant dielectric material such that each of the second holes extends from and is aligned with one of the first holes, and for each one of the second holes extending from and aligned with one of the first holes, forming conductive material extending through the one first hole and the one second hole.

Other objects and features of the present invention will become apparent by a review of the specification, claims and appended figures.

DETAILED DESCRIPTION OF THE INVENTION

Figure 2:
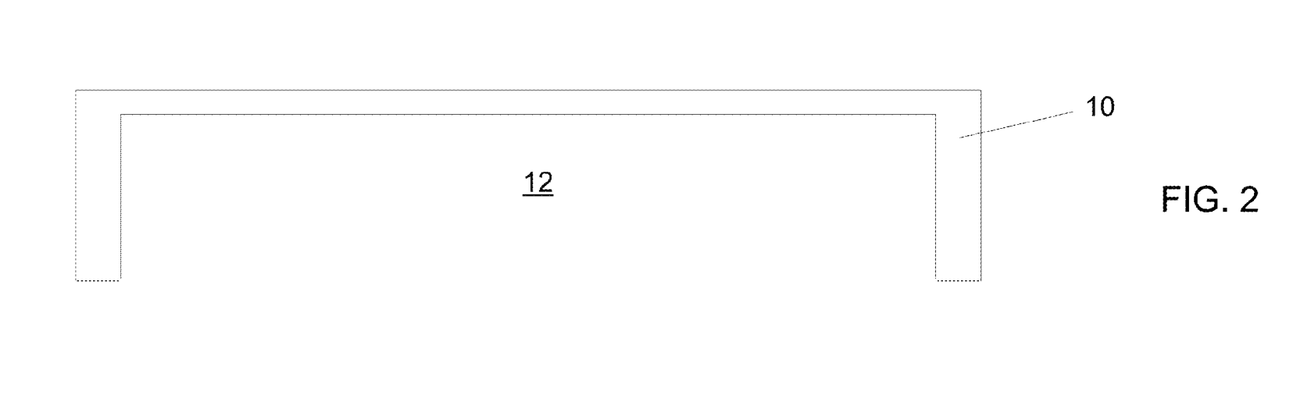
FIGS. 2-7 are cross sectional side views showing in sequence the steps in the forming the interposer of the present invention.

The present invention is 3D interposer, the formation thereof as described below and illustrated in FIGS. 2-7. The formation process begins with a crystalline substrate handler 10 as shown in FIG. 2. A non-limiting example can include a handler of crystalline substrate having a thickness of around 600 μm. A cavity 12 is formed in the handler by the use of a laser, a plasma etching process, a sandblasting process, a mechanical milling process, or any other similar method. Preferably cavity 12 is formed by photo-lithography plasma etching, which includes forming a layer of photo resist on the handler 10, patterning the photo resist layer to expose a select portion of handler 10, and then performing a plasma etch process (e.g. using a SF6 plasma) to remove the exposed portion of the handler 10 to form the cavity 12. Preferably, the cavity 12 extends no further than ¾ of the crystalline substrate thickness, or at least leaves a minimum thickness of around 50 μm. The plasma etch can be anisotropic, tapered, isotropic, or combinations thereof.

Figure 3:
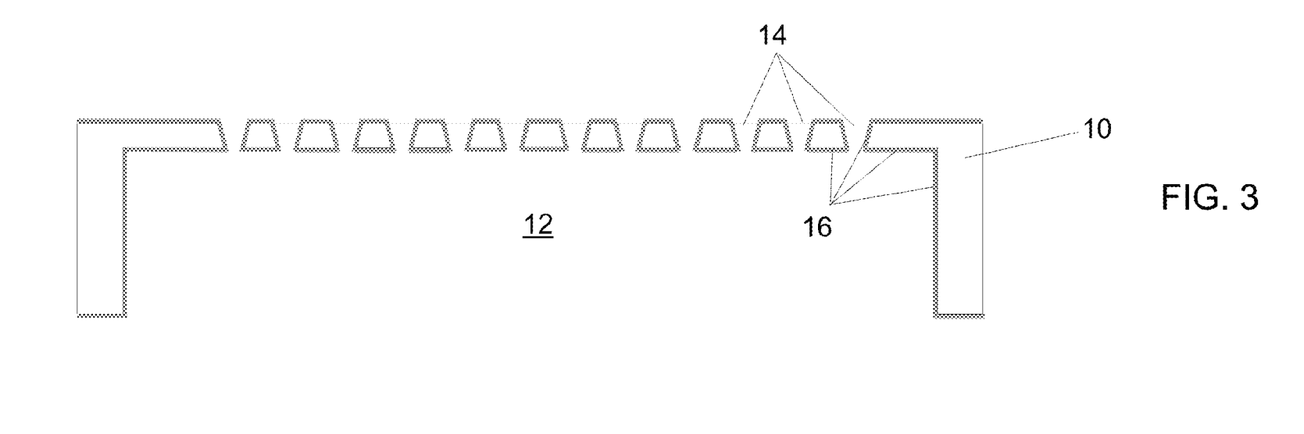

Through holes 14 are then formed through the thinned portion of handler 10, whereby the extend from the cavity 12 to the upper surface, as illustrated in FIG. 3. Holes 14 can be formed using a laser, a plasma etching process, a combination of plasma and wet etch, a sandblasting process, or any similar method. Preferably, the through holes 14 are formed by plasma etching in a similar manner as the formation of the cavity 12 (except that the holes 14 extend all the way through the thinned portion of the crystalline substrate handler 10). Plasma silicon etching (e.g. anisotropic, tapered, isotropic, or combinations thereof) allows for various shapes of the hole profile. Preferably, the profile of holes 14 is tapered, with a smaller dimension at the cavity side of the holes 14, and a larger dimension at the top surface of the handler 10. Preferably the minimum hole diameter is around 10 μm, and the angles of the walls are between 5° and 45° relative to a direction perpendicular to the surfaces of the crystalline substrate through which the holes 14 are formed, such that the hole has a larger cross-sectional size at its top surface than the surface facing cavity 12. All exposed surfaces of handler 10 (or at least the surfaces defining cavity 12, the sidewalls of holes 14 and the top surface of handler 10) are then coated with a layer 16 of insulation material as shown in FIG. 3 (i.e. applied using a spray process, a PECVD process, an electrochemical deposition process, etc.). In a preferred non-limiting embodiment, insulation material layer 16 can be silicon dioxide ($SiO_2$), applied using a PECVD process, with a minimum thickness of 100 Angstroms.

Figure 4:
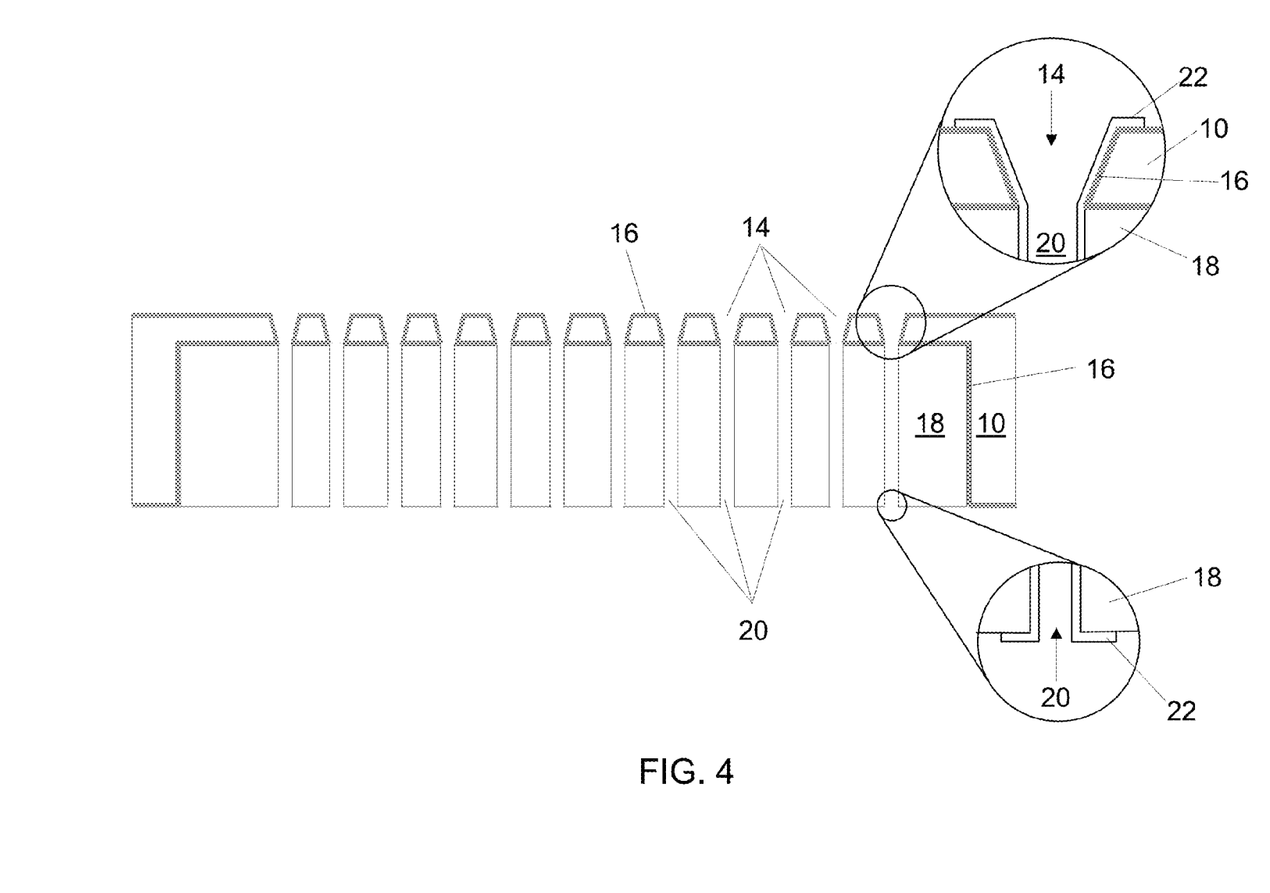

The cavity 12 is then filled with a compliant dielectric material 18 as shown in FIG. 4, using a spin coating process, a spray process, a dispense process, an electrochemical deposition process, a lamination process, or any other similar method. The compliant dielectric is a relatively soft material (e.g. solder mask) that exhibits compliance in all three orthogonal directions, and can accommodate the coefficient of thermal expansion (CTE) mismatch between the crystalline substrate (~2.6 ppm/° C.) and Cu (~17 ppm/° C.) interconnect. The compliant dielectric material 18 is preferably a polymer, such as BCB (Benzocyclobutene), solder mask, solder resist, FR4, mold compound, or BT epoxy resin. Through holes 20 are then formed through the dielectric material 18, and are aligned with holes 14. Holes 20 can be formed by using a CO2 laser (e.g. spot size of about 70 μm) for larger sized holes 20, or a UV laser (e.g. spot size of about 20 μm at a wavelength of 355 nm) for smaller sized holes 20 (e.g. less than 50 μm in diameter). Laser pulse frequencies between 10 and 50 kHz at a pulse length of less than 140 ns can be used. Preferably, through holes 20 have a minimum diameter of 10 μm, and are slanted no more than 15 degrees relative to vertical.

The side walls of the through holes 20 are then metalized (i.e. coated with a metallization layer 22). The metallization process preferably starts with the desmear process for removing any resin smeared on the interior walls of the through holes 20 (caused by the drilling through dielectric materials such as epoxy, polyimide, cyanate ester resins, etc). The process involves contacting the resin smear with a mixture of gamma-butyrolactone and water to soften the resin smear, followed by treatment with an alkaline permanganate solution to remove the softened resin, and treatment with an aqueous acidic neutralizer to neutralize and remove the permanganate residues. After desmear treatment, the initial conductive metallization layer 22 is formed by electroless copper plating, followed by a photo-lithography etch back so that the metallization layer extends away from the holes 20 along dielectric 18 (at the bottom of holes 20) and away from the holes 14 along insulation layer 16 (at the top of holes 14), both for a short distance (e.g. 25 μm or more). Adhesion is obtained at the plated interface by an anchor effect from the surface roughness. The resulting structure is shown in FIG. 4.

Figure 5:
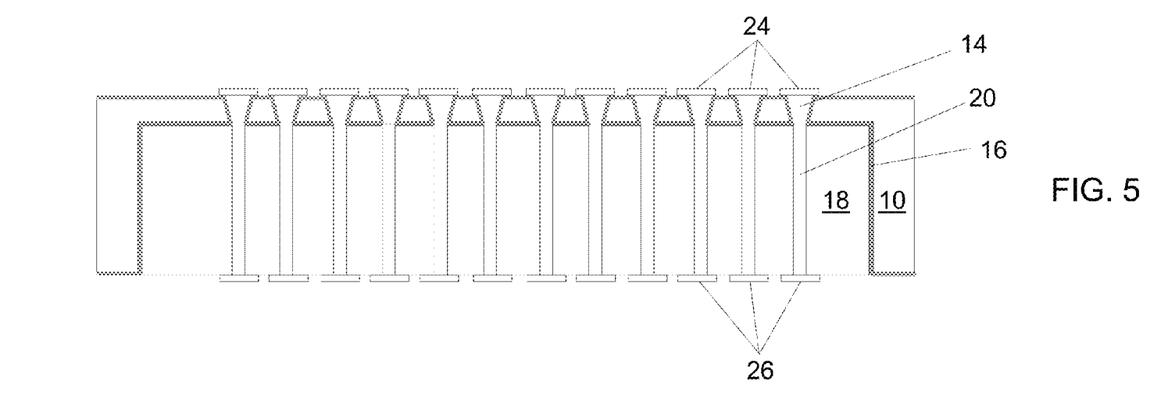

Metal contacts are then formed at both ends of the hole combinations 14/20 by depositing a layer of metal (e.g. by metal sputtering) over insulation layer 16 (and those portions of metal layers 22 extending from holes 14), and over dielectric material 18 (and those portions of metal layers 22 extending from holes 20). The deposition of a photo-imagable resist layer is then performed, followed by a photo lithography step (i.e. UV exposure through a mask and selective resist layer removal), followed by selective metal etching of those portions exposed by the photo resist removal, and photo resist removal. The resulting structure is shown in FIG. 5, where metal contacts 24 are disposed over holes 14 and in electrical contact with metal layers 22 extending therefrom, and metal contacts 26 are disposed over holes 20 and in electrical contact with metal layers 22 extending therefrom.

Figure 6:
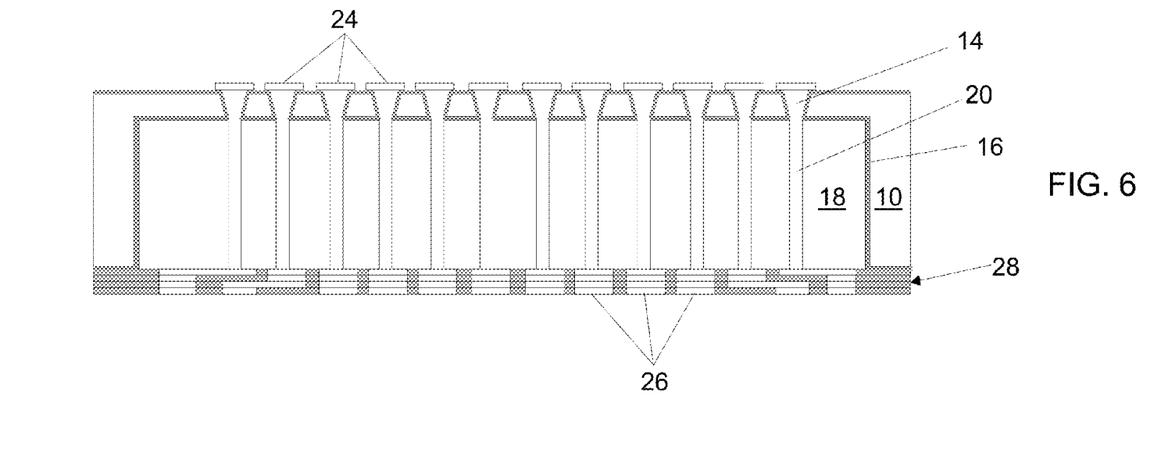
Figure 7:
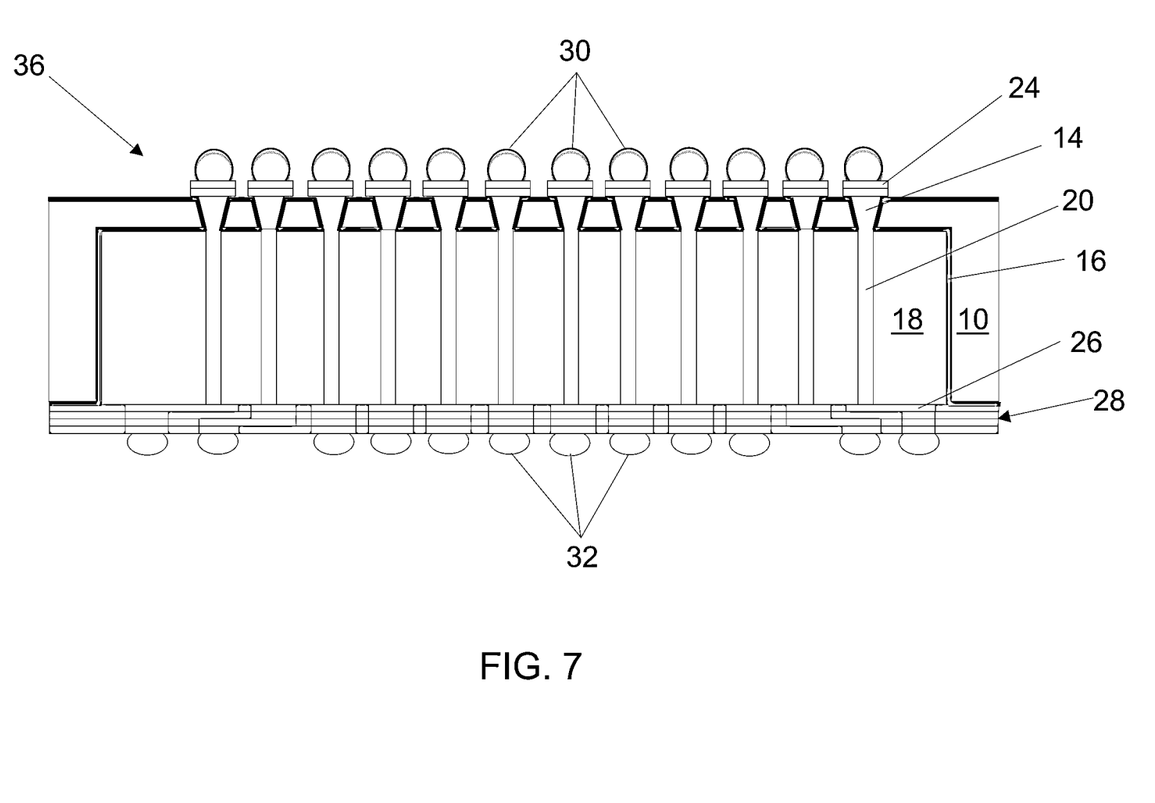

The metal contacts 26 can be extended, fanned out, or fanned in by performing a series of alternating insulation and conductive layer formations in combination with photolithography steps to create routing layers 28 that route the electrical contacts 26 to their desired final position on the bottom surface of the interposer, as illustrated in FIG. 6. These routing layers also encapsulate the compliant dielectric material 18 in cavity 12. Upon completion of the routing process, the outer metal layer can be plated with Ni and Au. Metal contacts 24 can also be extended upwards with additional metal layers (e.g. copper) formed by metal deposition and lithographic etch. BGA interconnects 30 and 32 are then formed on metal contacts 24 and 26 respectively using a screen printing process of a solder alloy, or by a ball placement process, or by a plating process. BGA (Ball Grid Array) interconnects are rounded conductors for making physical and electrical contact with counterpart conductors, usually formed by soldering or partially melting metallic balls onto bond pads. The resulting structure is the interposer assembly 36 shown in FIG. 7.

Figure 8:
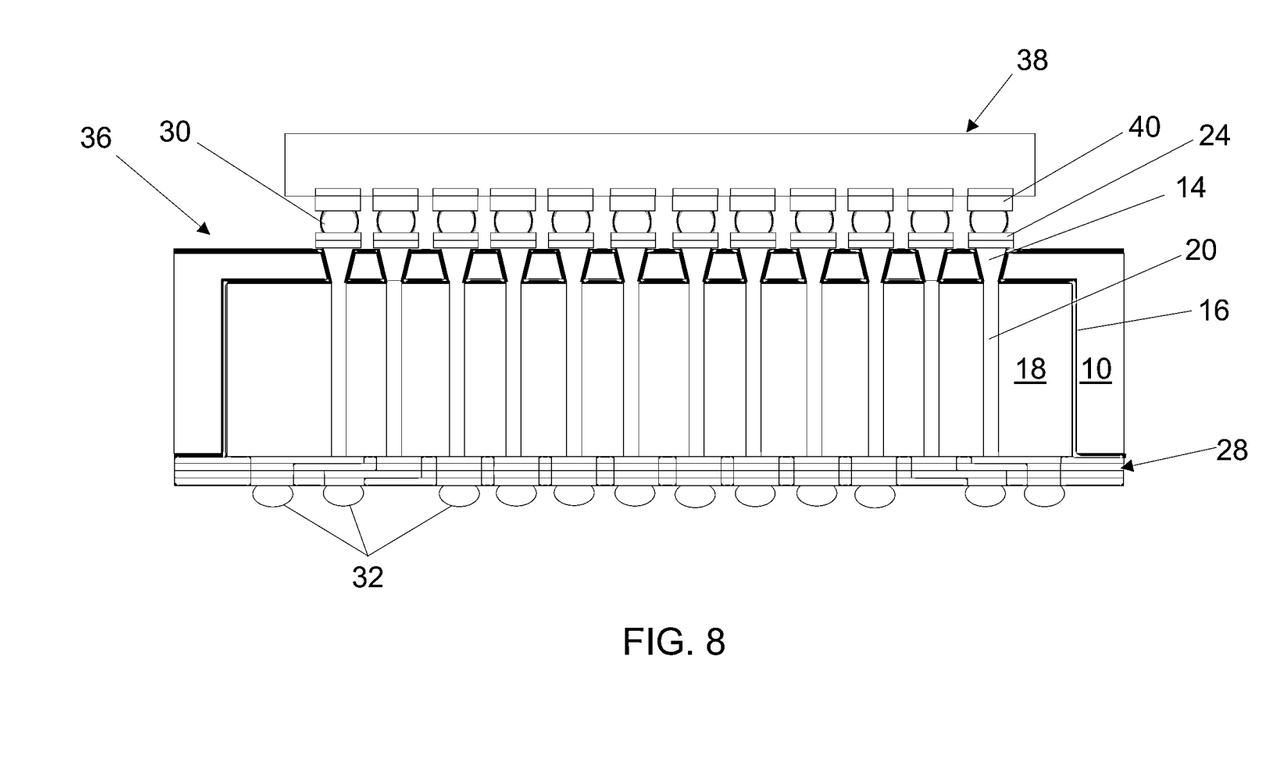
FIG. 8 is a side cross sectional view of an IC device integrated to the interposer of the present invention.

An IC chip 38 can then integrated (i.e. mechanically attached or mounted) to interposer 36 as illustrated in FIG. 8, where BGA interconnects 30 contact and make electrical connections with bond pads 40 of the IC chip 38. Integration can be performed using conventional pick-and-place or die attachment equipment. Preferably this is performed in a heated environment, so that BGA interconnects 30 bond with (and make a secure electrical connection between) both metal contacts 24 and bond pads 40. With the resulting structure shown in FIG. 8, each bond pad 40 of the IC chip 38 is electrically connected to at least one of the BGA interconnects 32 on the bottom of the interposer 36 via BGA interconnect 30, metal contact 24, metal layer 22 extending through holes 14/20, and metal contacts 26 (extending through routing layers 28).

Interposer 36 and the method of its manufacture described above and illustrated in the figures have several advantages. First, holes 14/20 and metal layers 22 therein form electrical interconnects that transfer signals through the interposer, and electrically couple the BGA interconnects 30 to BGA interconnects 32. Second, forming long holes through the crystalline handler is avoided, instead forming shorter holes 14 through a thinned portion of the hander 10. Forming longer holes 20 through dielectric 18 is easier and requires less expensive equipment and processing compared to forming longer holes through crystalline silicon which requires expensive silicon etching equipment and processing. Third, the combination of insulation layer 16 and dielectric 18 provides superior electrical insulation. Fourth, mechanical stresses are reduced because the thermal and mechanical characteristics of dielectric material 18 better match that of the PCB to which the interposer 36 will be mounted, as compared to if the interposer was primarily crystalline silicon through its entire thickness. Fifth, dielectric material 18 additionally provides superior mechanical insulation.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order separately or simultaneously that allows the proper formation of the interposer of the present invention. Single layers of material could be formed as multiple layers of such or similar materials, and vice versa. While the formation of the metal contacts through holes 14/20 is shown and described as a metal layer 22 formed along the sidewalls of holes 14/20, they can alternately be formed by completely filling the holes 14/20 with metal or other conductive materials. Or, the metal material can be formed along the sidewalls of holes 14 while completely filling holes 20, or vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming an interposer, comprising:
    forming a cavity in a crystalline substrate handler which has opposing first and second surfaces, wherein the cavity is formed into the first surface of the crystalline substrate handler;
    forming a plurality of first holes through the crystalline substrate handler extending from the second surface to the cavity;
    forming a layer of insulation material on a surface of the handler that defines the cavity and on sidewalls of the first holes;
    forming a compliant dielectric material in the cavity;
    forming second holes through the compliant dielectric material such that each of the second holes extends from and is aligned with one of the first holes; and
    for each one of the second holes extending from and aligned with one of the first holes, forming conductive material extending through the one first hole and the one second hole.

2. The method of claim 1, wherein the compliant dielectric material includes a polymer.

3. The method of claim 1, wherein each of the first holes is tapered such that the first hole has a smaller cross-sectional dimension at the cavity than at the second surface.

4. The method of claim 1, wherein for each of the first holes, the sidewall of the first hole extends in a direction between 5° and 45° relative to a direction that is perpendicular to the first and second surfaces.

5. The method of claim 1, wherein for each one of the second holes extending from and aligned with one of the first holes, further comprising:
    forming a first metal contact disposed over the first hole, insulated from the second surface, and electrically coupled to the conductive material; and
    forming a second metal contact disposed over the compliant dielectric material and the second hole, and electrically coupled to the conductive material,
    wherein the first metal contact is electrically coupled to the second metal contact via the conductive material extending through the first and second holes.

6. The method of claim 5, further comprising:
    forming a first plurality of rounded interconnects each electrically coupled to one of the first metal contacts; and
    forming a second plurality of rounded interconnects each electrically coupled to one of the second metal contacts.

7. The method of claim 5, further comprising:
    forming one or more layers of insulation materials disposed over the first surface and over the compliant dielectric material wherein the one or more layers of insulation materials encapsulates the compliant dielectric material in the cavity, and wherein the second metal contacts extend through the one or more layers of insulation materials.

8. The method of claim 5, further comprising:
    mounting an IC device, that includes a plurality of bond pads, over the second surface such that the plurality of bond pads are electrically coupled to the first plurality of rounded interconnects.

9. The method of claim 1, wherein the forming of the second holes is performed using laser light.

10. The method of claim 1, wherein the forming of the conductive material is performed using a metal plating process to form a layer of metal on sidewalls of the first and second holes.

\* \* \* \* \*